United States Patent

Harima

(10) Patent No.: US 6,882,232 B2
(45) Date of Patent: Apr. 19, 2005

(54) SURFACE-MOUNT CRYSTAL OSCILLATOR

(75) Inventor: Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 74 days.

(21) Appl. No.: 10/636,881

(22) Filed: Aug. 7, 2003

(65) Prior Publication Data

US 2004/0036547 A1 Feb. 26, 2004

(30) Foreign Application Priority Data

Aug. 9, 2002 (JP) .................................... 2002-232388

(51) Int. Cl.[7] .............................................. H03B 5/36
(52) U.S. Cl. ................. 331/68; 331/108 D; 331/158; 310/318
(58) Field of Search .................... 331/68–69, 108 C, 331/108 D, 116 R, 116 FE, 158; 310/318

(56) References Cited

U.S. PATENT DOCUMENTS

2004/0085147 A1 * 5/2004 Harima et al. .............. 331/158

* cited by examiner

*Primary Examiner*—David Mis
(74) *Attorney, Agent, or Firm*—Katten Muchin Zavis Rosenman

(57) ABSTRACT

A surface-mount quartz crystal oscillator has a quartz crystal unit, a mounting substrate joined to a reverse surface of the crystal unit, an IC (Integrated Circuit) chip accommodated in the mounting substrate and electrically connected to the crystal unit in providing an oscillating circuit, and a chip device such as a bypass capacitor mounted on the mounting substrate. The mounting substrate has a bottom wall, a frame wall mounted on the bottom wall, and a recess defined in at least one principal surface thereof and surrounded by the frame wall, with the IC chip being disposed in the recess. The frame wall has at least one opening defined therein, and the bottom wall has a smaller thickness at a position aligned with the opening than other positions on the bottom wall. The chip device is disposed in the position on the bottom wall.

8 Claims, 4 Drawing Sheets

SURFACE-MOUNT CRYSTAL OSCILLATOR

BACKGROUND OF THE INVENTION

1. Field of the Invention

The present invention relates to a surface-mount quartz crystal oscillator having a quartz crystal unit and an IC (Integrated circuit) chip having an oscillating circuit which uses the crystal unit, and more particularly to a surface-mount crystal oscillator which accommodates electronic components other than an IC chip and is of a small overall height.

2. Description of the Related Art

Since surface-mount crystal oscillators are small in size and weight, they are widely used as a frequency or time reference source in portable electronic devices. In view of the trends toward smaller electronic devices, efforts are being made to achieve more reductions in planar profile dimensions and height of surface-mount crystal oscillators. One type of a surface-mount crystal oscillator accommodates an IC chip in a space separate from a crystal unit.

FIG. 1A shows by way of example a conventional surface-mount crystal oscillator. As shown in FIG. 1A, the conventional surface-mount crystal oscillator comprises crystal unit 1 and mounting substrate 2. Crystal unit 1 has casing 3 having a recess defined therein, quartz crystal blank 4 disposed in the recess, and cover 5 of metal placed on casing 3 and hermetically sealing crystal blank 4 in the recess. Cover 5 is joined by seam welding, for example, to the upper surface of a frame wall which surround the recess in casing 3.

Connecting terminals 6 are disposed on the respective four corners of an outer bottom surface, i.e., a reverse surface, of casing 3. Connecting terminals 6 include a pair of crystal connecting terminals electrically connected to crystal blank 4. Connecting terminals 6 also include a ground terminal electrically connected to cover 5, for example. A pair of connecting electrodes (not shown) is formed on the bottom surface of the recess in casing 3 and electrically connected to the crystal connecting terminals through electrically conductive paths on casing 3.

Crystal blank 4 comprises a substantially rectangular AT-cut quartz crystal blank, for example. Excitation electrodes (not shown) are formed respectively on the principal surfaces of crystal blank 4, and extension electrodes (not shown) extend from the respective excitation electrodes to opposite sides of one end of crystal blank 4. The sides of the end of crystal blank 4 to which the extension electrodes extend are fixed to the connecting electrodes formed on the bottom surface of the recess in casing 3 by electrically conductive adhesive 7. Crystal blank 4 is thus held horizontally in casing 3 and electrically and mechanically connected thereto.

Mounting substrate 2 is made of laminated ceramics and has a substantially rectangular elongate planar shape with a recess defined in one principal surface thereof. Actually, mounting substrate 2 comprises bottom wall 8 in the form of a substantially rectangular plate and frame wall 9 in the form of a substantially rectangular frame. Frame wall 9 serves as a side wall of the recess. Connecting terminals 11 are arranged on the upper surface of frame wall 9 which surrounds the recess in alignment with respective connecting terminals 6 on casing 3. Connecting terminals 6 on casing 3 and connecting terminals 11 on mounting substrate 2 are electrically and mechanically connected to each other by, for example, soldering, thus completing the surface-mount crystal oscillator. Mounting terminals 10 which include terminals such as a power supply terminals, a ground terminal, and an output terminal are disposed on the four corners of an outer bottom surface of bottom wall 8. Mounting terminals 10 are used to mount the surface-mount crystal oscillator on a wiring board.

IC chip 12 is fixed to the bottom surface of the recess in mounting substrate 2 by ultrasonic thermo-compression bonding or thermo-compression bonding with bumps 13, for example, interposed therebetween. IC chip 12 is electrically connected to mounting terminals 10 and connecting terminals 11 by electrically conductive paths on mounting substrate 2. Frame wall 9 has cavities defined in surfaces thereof facing the recess in mounting substrate 2, and chip capacitors 14 are accommodated in the respective cavities, as shown in FIG. 1B. Chip capacitors 14 are bypass capacitors having a large capacitance, for example, which are difficult to integrate in IC chip 12. Chip capacitors 14 are electrically connected to IC chip 12.

To protect the surface of IC chip 12 which is joined to bumps 13, resin 15 is poured and solidified in the recess in mounting substrate 2 to the extent that IC chip 12 is embedded in resin 15 up to about half of the thickness thereof.

In view of the tendency in the art to reduce the size of surface-mount crystal oscillators of the above structure, the recess in mounting substrate 2 has its internal dimensions reduced, allowing only IC chip 12 to be housed therein and making it difficult to accommodate chip capacitors 14 even in the presence of the cavities in frame wall 9. With IC chip 12 and chip capacitors 14 being installed in the recess in mounting substrate 2, since chip capacitors 14 are generally of a greater height than IC chip 12, it is difficult to reduce the height of the surface-mount crystal oscillator because of limitations posed by the height of chip capacitors 14.

SUMMARY OF THE INVENTION

It is therefore an object of the present invention to provide a surface-mount crystal oscillator which includes electronic components such as chip capacitors, and can easily be reduced in overall size, particularly height.

The above object can be achieved by a surface-mount crystal oscillator having a crystal unit, a mounting substrate joined to a reverse surface of the crystal unit, an IC (Integrated Circuit) chip accommodated in the mounting substrate, and a chip device mounted on the mounting substrate, wherein the mounting substrate has a bottom wall, a frame wall mounted on the bottom wall, and a recess defined in at least one principal surface thereof and surrounded by the frame wall, the IC chip is disposed in the recess, the frame wall has at least one opening defined therein, the bottom wall is a smaller thickness at a position aligned with the opening than other positions on the bottom wall, and the chip device is disposed in the position on the bottom wall.

Since the chip device is accommodated in the opening in the frame wall and the bottom wall is thinner in the position where the chip device is accommodated than in the other positions on the bottom wall, the surface-mount crystal oscillator has small planar profile dimensions and a small height even if the chip device is of a relatively large height.

DETAILED DESCRIPTION OF THE INVENTION

Figure 1A:
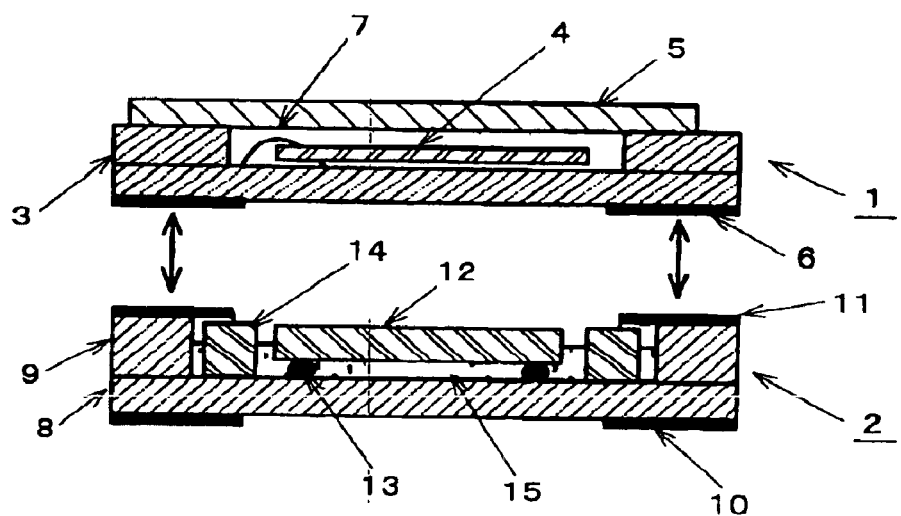
FIG. 1A is an exploded cross-sectional view of a conventional surface-mount crystal oscillator.
Figure 1B:
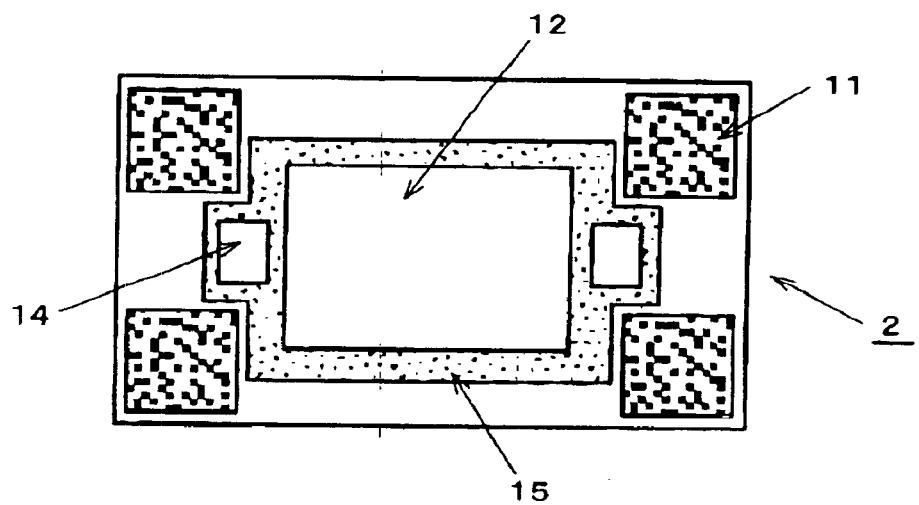
FIG. 1B is a plan view of a mounting substrate used in the surface-mount crystal oscillator shown in FIG. 1A.
Figure 2A:
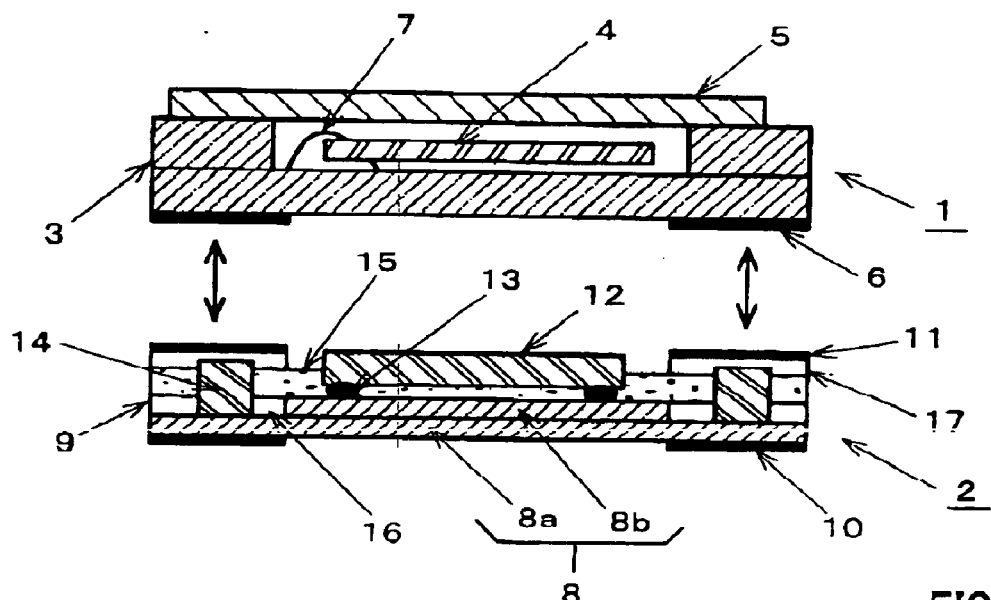
FIG. 2A is an exploded cross-sectional view of a surface-mount crystal oscillator according to a first embodiment of the present invention.
Figure 2B:
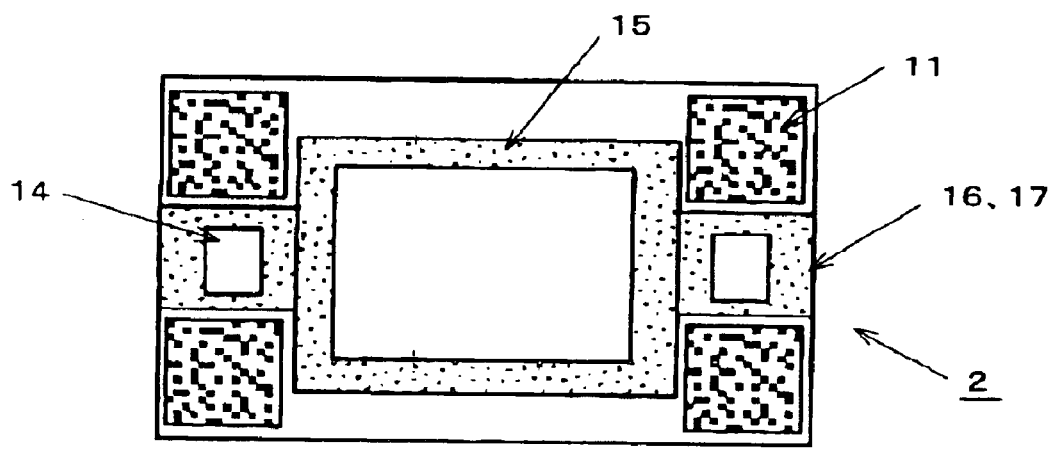
FIG. 2B is a plan view of a mounting substrate used in the surface-mount crystal oscillator shown in FIG. 2A.

In FIGS. 2A and 2B which show a surface-mount quartz crystal oscillator according to a first embodiment of the present invention, the constituent elements which are identical to those shown in FIGS. 1A and 1B are denoted by identical reference characters, and will not be described in detail below.

The surface-mount crystal oscillator according to the first embodiment comprises quartz crystal unit 1 having hermetically sealed quartz crystal blank 4 and connecting terminals 6 on its outer bottom surface, and mounting substrate 2 joined to the outer bottom surface of crystal unit 1. Crystal unit 1 is identical to the crystal unit shown in FIG. 1A.

Mounting substrate 2 has bottom wall 8 constructed of two layers, that is, first and second layers 8a, 8b stacked one on the other with frame wall 9 mounted on second layer 8b. Therefore, mounting substrate 2 is basically of a three-layer structure. Connecting terminals 11 are disposed on an upper surface of frame wall 9.

Figure 3:
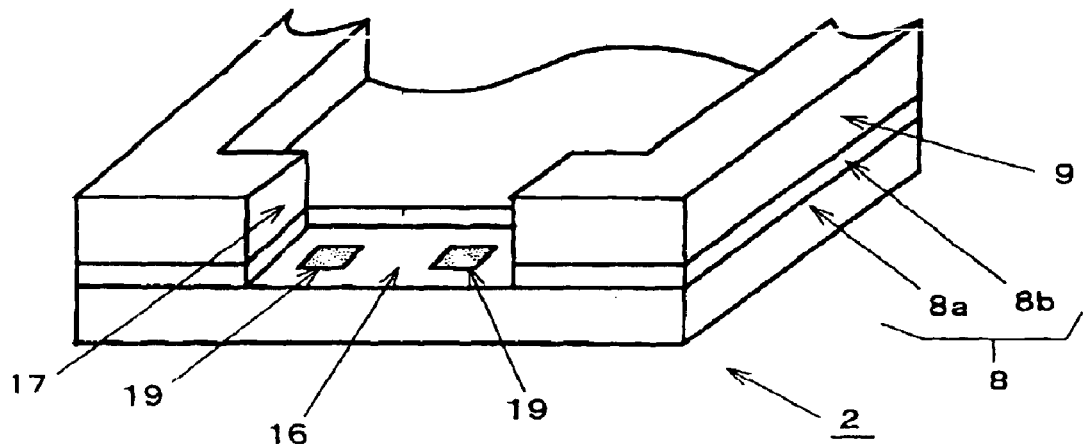
FIG. 3 is a fragmentary perspective view of the mounting substrate shown in FIG. 2B.

First layer 8a of bottom wall 8 is in the form of a substantially rectangular elongate plate with mounting terminals 10 disposed on a lower surface thereof. Second layer 8b of bottom wall 8 is of the same shape as first layer 8a, but differs therefrom in that it has rectangular cavities 16 defined centrally in respective sides on the longitudinal opposite ends of second layer 8b, as also shown in FIG. 2B. Portions of frame wall 9 are removed in vertical coextensive alignment with rectangular cavities 16 in second layers 8b. As shown in FIG. 3, first layer 8b has its upper surface exposed in those removed portions in frame wall 9 and rectangular cavities 16 in second layers 8b. Thus, frame wall 9 has openings 17 above rectangular cavities 16 in second layers 8b, and hence is open at the opposite ends of mounting substrate 2. A pair of chip terminals 19 is disposed on the exposed surface of first layer 1a in cavities 16.

Such mounting substrate 2 is produced by laminating green sheets with base layer electrodes formed thereon to provide an electrode pattern (i.e., electrically conductive paths) including chip terminals 19, and then baking the laminated green sheets together.

The surface-mount crystal oscillator according to the present embodiment has IC (Integrated Circuit) chip 12 and two chip capacitors 14 mounted on mounting substrate 2. IC chip 12 is fixed to a central area of the bottom surface of the recess in mounting substrate 2 by ultrasonic thermocompression bonding with bumps 13 in the same manner as the conventional crystal oscillator. Stated otherwise, IC chip 12 is fixed to a central area of the upper surface of second layer 8b of bottom wall 8. Chip capacitors 14 are mounted in the respective openings 17 in frame wall 9 on the respective opposite ends of mounting substrate 2. Chip capacitors 14 are electrically and mechanically connected by soldering or the like to chip terminals 19 disposed on the upper surface of first layer 8a of bottom wall 8. After chip capacitors 14 are connected to chip terminals 19, resin 15 is poured and solidified in the recess in mounting substrate 2 including cavities 17 in order to protect the joined surface of IC chip 12. Connecting terminals 11 on the upper surface of frame wall 9 and connecting terminals 6 of crystal unit 1 are joined to each other by soldering or the like, thus joining mounting substrate 2 to the lower surface of crystal unit 1, whereupon the surface-mount crystal oscillator is completed.

With the above arrangement, since frame wall 9 has openings 17 and chip capacitors 14 are disposed in respective openings 17, chip capacitors 14 can be placed in the surface-mount crystal oscillator even if the surface-mount crystal oscillator has its planar profile dimensions are reduced. Bottom wall 8 is of a two-layer structure with thinner regions provided therein and chip capacitors 14 are disposed in those thinner regions. Therefore, the height of chip capacitors 14 can be reduced with respect to the height of IC chip 12. The surface-mount crystal oscillator can thus be of a smaller height than the conventional surface-mount crystal oscillator. It may be possible to reduce the height of the surface-mount crystal oscillator by reducing the thickness of the bottom wall in its entirety. However, the reduced thickness of the bottom wall in its entirety results in a lack of sufficient mechanical strength of mounting substrate 2, tending to cause damage to the surface-mount crystal oscillator. According to the present embodiment, cavities 16 are defined only partly in bottom wall 8, and hence bottom wall 8 is thinner in only those cavities 16. Therefore, bottom wall 8 as a whole is sufficiently mechanically strong against damage.

Figure 4A:
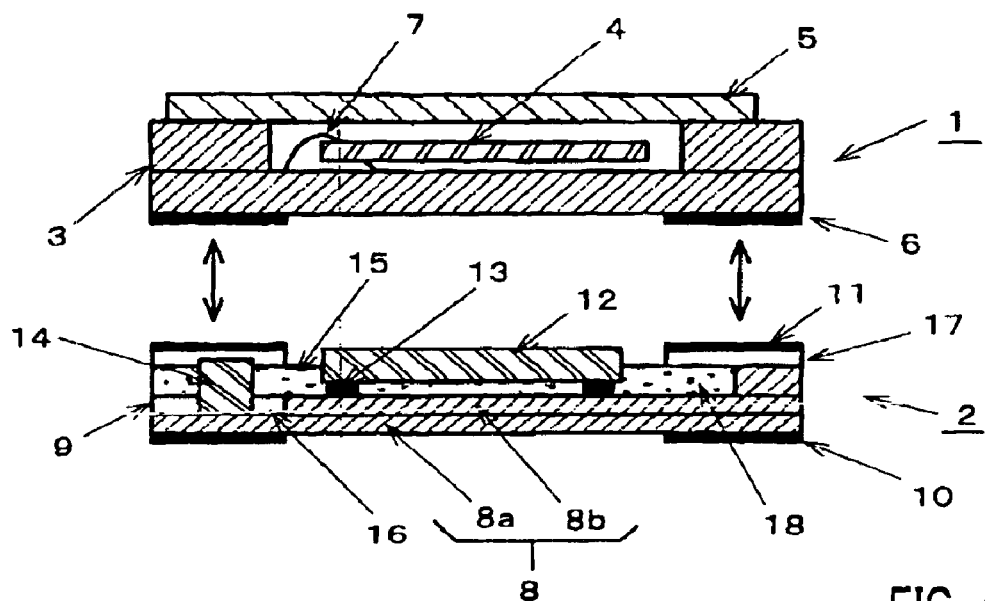
FIG. 4A is an exploded cross-sectional view of a surface-mount crystal oscillator according to a second embodiment of the present invention.
Figure 4B:
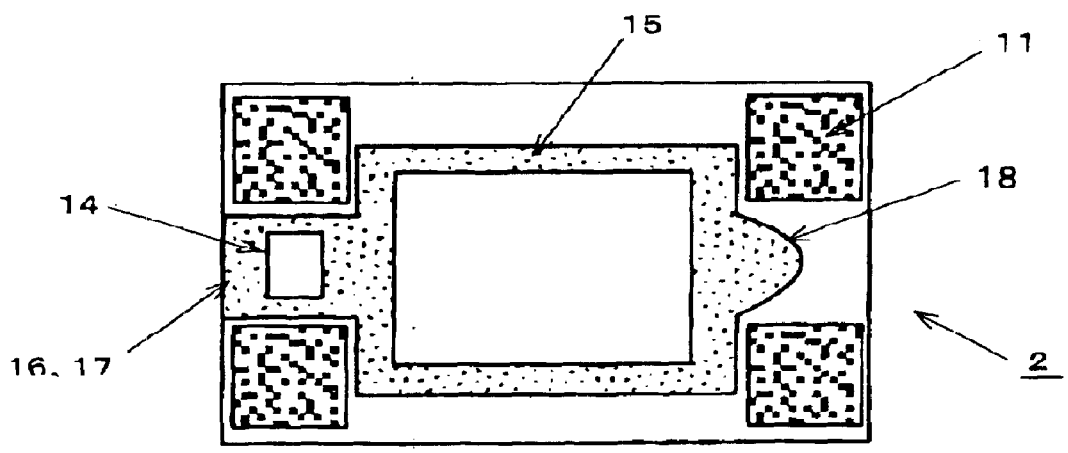
FIG. 4B is a plan view of a mounting substrate used in the surface-mount crystal oscillator shown in FIG. 4A.

A surface-mount crystal oscillator according to a second embodiment of the present invention will be described below with reference to FIGS. 4A and 4B. In the first embodiment, two chip capacitors 14 are accommodated in respective openings 17 defined in frame wall 9 at the opposite ends of mounting substrate 2. According to the second embodiment, the surface-mount crystal oscillator has one chip capacitor 14. Specifically, the surface-mount crystal oscillator according to the second embodiment has opening 17 defined in frame wall 9 at only one longitudinal end of mounting substrate 2. Second layer 8b of bottom wall 8 also has cavity 16 defined therein in vertical coextensive alignment with opening 17. Chip capacitor 14 is mounted on first layer 8a of bottom wall 8 in opening 17. Frame wall 9 has no opening at the opposite longitudinal end of mounting substrate 2, but has arcuate cavity 18 defined in an inner wall surface thereof and communicating with the recess in mounting substrate 2.

The structure of the surface-mount crystal oscillator according to the second embodiment allows mounting substrate 2 to have reduced planar profile dimensions and also a reduced height in the same manner as the first embodiment. Resin 15 can easily be poured into the recess in mounting substrate 2 from an injection needle (not shown) whose tip end is inserted into arcuate cavity 18 in frame wall 9. When resin 15 is poured only from cavity 18, chip capacitor 14 functions as a dam for preventing the viscous resin from flowing out of opening 17. If chip capacitor 14 only is not enough to prevent the resin from flowing out of opening 17, then chip terminals for connecting chip terminal 14 may be extended to the outermost end of opening 17 and may be coated with a solder layer which functions as a dam against leakage of the resin.

In the first embodiment, since the resin is poured through the gaps between IC chip 12 and chip capacitors 14, the resin is liable to flow out of the openings 17 and may possibly be attached to the outer surface of the mounting substrate. The resin thus attached to the outer surface of the mounting substrate may possibly cause trouble. Therefore, when the surface-mount crystal oscillator according to the first embodiment is manufactured, some jig may be required to prevent resin 15 from flowing out of openings 17. Therefore, the surface-mount crystal oscillator according to the second embodiment is more advantageous from the viewpoint of preventing the resin from flowing out of opening 17.

In the above embodiments, the surface of mounting substrate 2 in which the recess is defined is joined to the reverse surface of crystal unit 1. However, the surface of mounting substrate 2 which is free of the recess may be joined to the reverse surface of crystal unit 1. In this case, casing 3 of crystal unit 1 and mounting substrate 2 may not be separate components, but the mounting substrate may be of an H-shaped cross section having recesses defined in respective principal surfaces thereof, one recess accommodating a crystal blank and the other recess accommodating an IC chip and other electronic components.

In the above embodiments, the chip capacitors are disposed in openings 17 defined in frame wall 9. However, other chip devices such as inductors, resistors, thermistors, etc. may be disposed in openings 17. Furthermore, the position of openings 17 is not limited to the central area of a side on one or both longitudinal ends of the mounting substrate, but may be in central area of a longitudinal side or sides of the mounting substrate, for example.

What is claimed is:

1. A surface-mount crystal oscillator comprising:
   a crystal unit;
   a mounting substrate joined to a reverse surface of said crystal unit;
   an IC chip accommodated in said mounting substrate; and
   a chip device mounted on said mounting substrate;
   wherein said mounting substrate has a bottom wall, a frame wall mounted on said bottom wall, and a recess defined in at least one principal surface thereof and surrounded by said frame wall, said IC chip is disposed in said recess, said frame wall has at least one opening defined therein, said bottom wall has a smaller thickness at a position aligned with said opening than other positions on the bottom wall, and said chip device is disposed in said position on the bottom wall.

2. The surface-mount crystal oscillator according to claim 1, wherein said mounting substrate has a substantially rectangular elongate planar profile, said opening being defined in a central area of each of sides at opposite longitudinal ends of said mounting substrate, said chip device being disposed in said opening.

3. The surface-mount crystal oscillator according to claim 1, wherein said chip device comprises a chip capacitor.

4. The surface-mount crystal oscillator according to claim 1, wherein the principal surface of said mounting substrate in which said recess is defined is joined to the reverse surface of said crystal unit.

5. The surface-mount crystal oscillator according to claim 1, wherein a resin is poured into said recess to protect a surface of said chip which faces a bottom surface of said recess.

6. The surface-mount crystal oscillator according to claim 5, wherein said mounting substrate has a substantially rectangular elongate planar profile, said opening being defined in a central area of a side at one of opposite longitudinal ends of said mounting substrate, said frame wall having a cavity defined therein in a side at the other of opposite longitudinal ends of said mounting substrate, for pouring the resin through said cavity into said recess.

7. The surface-mount crystal oscillator according to claim 6, wherein said chip device comprises a chip capacitor.

8. The surface-mount crystal oscillator according to claim 1, wherein said mounting substrate is made of laminated ceramics.

* * * * *